(12) United States Patent
Ogata (10) Patent No.: US 7,755,428 B2
(45) Date of Patent: Jul. 13, 2010

(54) AMPLIFYING CIRCUIT

(75) Inventor: Takashige Ogata, Ora-gun (JP)

(73) Assignees: Sanyo Electric Co., Ltd., Moriguchi (JP); Sanyo Semiconductor Co., Ltd., Gunma (JP)

( * ) Notice: Subject to any disclaimer, the term of this patent is extended or adjusted under 35 U.S.C. 154(b) by 48 days.

(21) Appl. No.: 12/230,065

(22) Filed: Aug. 22, 2008

(65) Prior Publication Data

US 2009/0058523 A1      Mar. 5, 2009

(30) Foreign Application Priority Data

Aug. 30, 2007   (JP)   ............................. 2007-224886

(51) Int. Cl.
*H03F 3/26* (2006.01)
(52) U.S. Cl. ..................... 330/269; 330/277; 330/255
(58) Field of Classification Search ............. 330/269, 330/277, 255
See application file for complete search history.

(56) References Cited

U.S. PATENT DOCUMENTS

| 5,856,760 | A  | * | 1/1999 | Lam et al. ............... 330/298 |
| 5,936,467 | A  | * | 8/1999 | Strickland ............... 330/255 |
| 6,757,129 | B2 | * | 6/2004 | Kuroiwa et al. .......... 360/78.04 |
| 7,012,465 | B2 | * | 3/2006 | Manetakis ............... 330/253 |
| 7,348,848 | B2 | * | 3/2008 | Huang .................... 330/253 |
| 7,498,876 | B2 | * | 3/2009 | Peruzzi et al. ............ 330/10 |
| 7,551,030 | B2 | * | 6/2009 | An et al. ................. 330/255 |

FOREIGN PATENT DOCUMENTS

JP     A-2003-115729     4/2003

* cited by examiner

*Primary Examiner*—Patricia Nguyen
(74) *Attorney, Agent, or Firm*—Oliff & Berridge, PLC (57) ABSTRACT

An amplifying circuit comprising an output stage circuit composed of a first and a second output transistor and operating as a class AB push-pull circuit reduces electricity consumed by an idle current. A pre-stage circuit outputs a first and a second control signal, and controls a channel current of the first and the second output transistor. In a period in which one control signal causes the corresponding output transistor to operate in class AB mode, the other control signal places the corresponding output transistor in a cutoff state.

2 Claims, 7 Drawing Sheets

(prior art)

AMPLIFYING CIRCUIT

CROSS-REFERENCE TO RELATED APPLICATION

The priority application number JP 2007-224886 upon which this patent application is based is hereby incorporated by reference.

BACKGROUND OF THE INVENTION

1. Field of the Invention

The present invention relates to an amplifying circuit, and particularly to a class AB push-pull amplifying circuit.

2. Description of the Related Art

Figure 6:
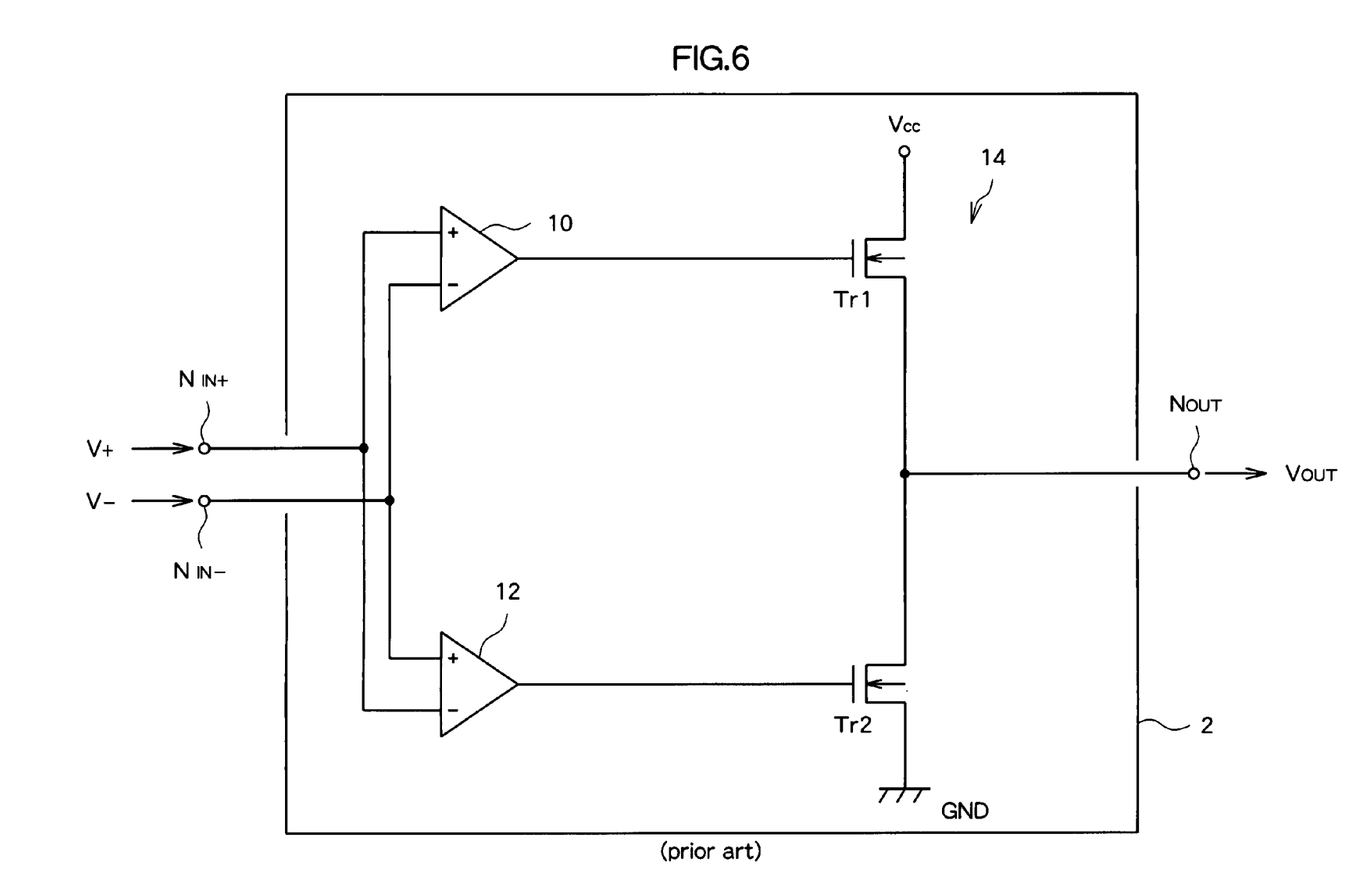
FIG. 6 is a schematic view showing a circuit configuration for a conventional class AB operational amplifier.

FIG. 6 is a schematic view showing a circuit configuration for an operational amplifier 2, which is a conventional class AB push-pull amplifying circuit. The operational amplifier 2 operates according to a voltage potential difference $V_{IN}$, in which voltage signals $V_+$ and $V_-$ are input at a non-inverting input terminal $N_{IN+}$ and an inverting input terminal $N_{IN-}$, respectively ($V_{IN} = V_+ - V_-$). The operational amplifier 2 outputs an output voltage signal $V_{OUT}$, in which $V_{IN}$ is amplified, from an output terminal $N_{OUT}$.

The operational amplifier 2 has pre-stage amplifiers 10, 12, and an output stage circuit 14. The output stage circuit 14 is a push-pull circuit composed of transistors Tr1, Tr2. Tr1 connects a drain-source channel between a positive electrical supply $V_{CC}$ and $N_{OUT}$, and Tr2 connects a drain-source channel between $N_{OUT}$ and a ground potential GND.

Tr1 is controlled by an output of the pre-stage amplifier 10, and Tr2 is controlled by an output of the pre-stage amplifier 12. In response to the fact that Tr1 and Tr2 are both n-channel MOS transistors, the differential input $V_{IN}$ to the operational amplifier 2 is fed to the pre-stage amplifier 10 and the pre-stage amplifier 12 with mutually opposite polarities. Each of the pre-stage amplifiers 10, 12 operates as a class AB amplifier, whereby the output stage circuit 14 operates as a class AB push-pull amplifying circuit.

Figure 7:
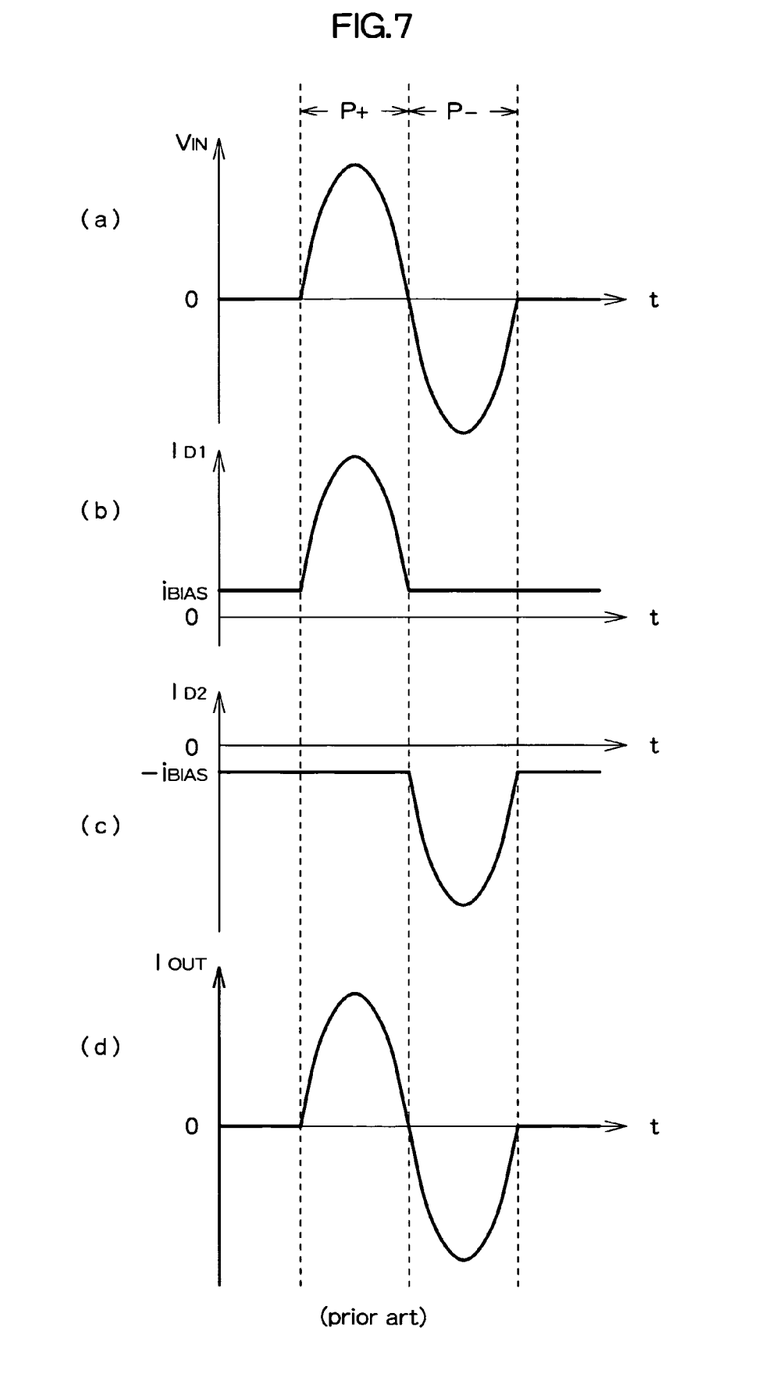
FIG. 7 is a signal waveform diagram that illustrates an operation of the conventional class AB operational amplifier shown in FIG. 6.

FIG. 7 is a signal waveform diagram that illustrates an operation of the operational amplifier shown in FIG. 6. The vertical axis of each signal waveform (a) to (c) represents the signal value, and the horizontal axis represents time. The signal waveform (a) shown in FIG. 7 depicts a single-period sine wave as an example of the differential input $V_{IN}$ of the operational amplifier. The signal waveforms (b), (c) shown in FIG. 7 depict the change over time of drain currents $I_{D1}$, $I_{D2}$ in Tr1, Tr2, respectively, with the current flowing to the output terminal $N_{OUT}$ in the positive direction. A signal waveform (d) shown in FIG. 7 depicts the change over time in an output current $I_{OUT}$ that is formed on the output terminal $N_{OUT}$.

As described above, the pre-stage amplifiers 10, 12 operate as class AB amplifiers, and the operating points on the amplifiers are biased in the positive direction in an amount equal to a prescribed voltage $v_{BIAS}$. The bias voltage $v_{BIAS}$ may be, e.g., approximately 0.7 V, which is the potential difference of a p-n junction. The pre-stage amplifiers 10, 12 output the bias voltage $v_{BIAS}$ when the respective differential inputs are zero or negative; and, when the differential inputs are positive, a voltage variance in response to the differential inputs fed to each pre-stage amplifier 10, 12 occurs on the output terminal based on $v_{BIAS}$. Since the differential input fed to the pre-stage amplifier 10 is $V_{IN}$, the output voltage changes to exceed $v_{BIAS}$ in the positive period $P_+$ of $V_{IN}$. The output of the pre-stage amplifier 10 is applied to the gate of Tr1, and the change in $I_{D1}$ illustrated by the signal waveform (b) of FIG. 7 occurs. Specifically, Tr1 increases the current $I_{D1}$ that flows to $N_{OUT}$ in the positive period $P_+$ of $V_{IN}$; and, during other periods, an idle current $i_{BIAS}$ corresponding to $v_{BIAS}$ is caused to flow. By contrast, the differential input of the pre-stage amplifier 12 is $-V_{IN}$; therefore, the output voltage changes to exceed $v_{BIAS}$ in the negative period $P_-$ of $V_{IN}$. The output of the pre-stage amplifier 12 is applied to the gate of Tr2, and the change in $I_{D2}$ illustrated by the signal waveform (c) of FIG. 7 occurs. Specifically, Tr2 increases the current $I_{D2}$ that is drawn from $N_{OUT}$ in the negative period $P_-$ of $V_{IN}$; and, during other periods, an idle current $i_{BIAS}$ corresponding to $v_{BIAS}$ is drawn from $N_{OUT}$.

The current $I_{OUT}$ combined $I_{D1}$ and $I_{D2}$ is formed on $N_{OUT}$, and $V_{OUT}$ is formed according to the load connected to $N_{OUT}$. An output signal waveform that varies according to $V_{IN}$ is obtained on $N_{OUT}$ as a result of the combining.

An idle current substantially does not appear in the output current $I_{OUT}$ because the $i_{BIAS}$ associated with Tr1 and Tr2 respectively cancel each other out in the output terminal $N_{OUT}$. Specifically, a problem is presented in that the idle current $i_{BIAS}$ passes from the power supply $V_{CC}$ to GND via Tr1, Tr2, and electricity is wastefully consumed. In particular, a large transistor is used in the output stage circuit 14 in order to ensure load driving capability. The $i_{BIAS}$ accordingly becomes larger, and more electricity is wastefully consumed.

[Patent document no. 1] Japanese Laid-open Patent Application No. 2003-115729.

SUMMARY OF THE INVENTION

The present invention was contrived in order to solve the above-stated problem, and provides an amplifying circuit that makes it possible to reduce electricity consumed by a pass-through current in a class AB push-pull circuit, which constitutes an output stage circuit.

According to the present invention, the amplifying circuit is presented, comprising: an output stage circuit provided with a first output transistor for controlling a conducting current based on a first control signal and a second output transistor for controlling a conducting current based on a second control signal, the transistors causing the output stage circuit to operate as a class AB push-pull circuit; and a pre-stage circuit, in which the first control signal and the second control signal are generated in accordance with an input signal; wherein, the first control signal causes the first output transistor to operate in class AB mode in a first ON period set in accordance with a positive signal period in which the input signal is positive, and places the first output transistor in a cutoff state in a first OFF period set in accordance with a negative signal period in which the input signal is negative; and the second control signal causes the second output transistor to operate in class AB mode in a second ON period set in accordance with the negative signal period, and places the second output transistor into a cutoff state in a second OFF period set in accordance with the positive signal period.

DESCRIPTION OF THE PREFERRED EMBODIMENTS

An embodiment of the present invention ("embodiment" hereunder) will now be described with reference to the accompanying drawings.

Figure 1:
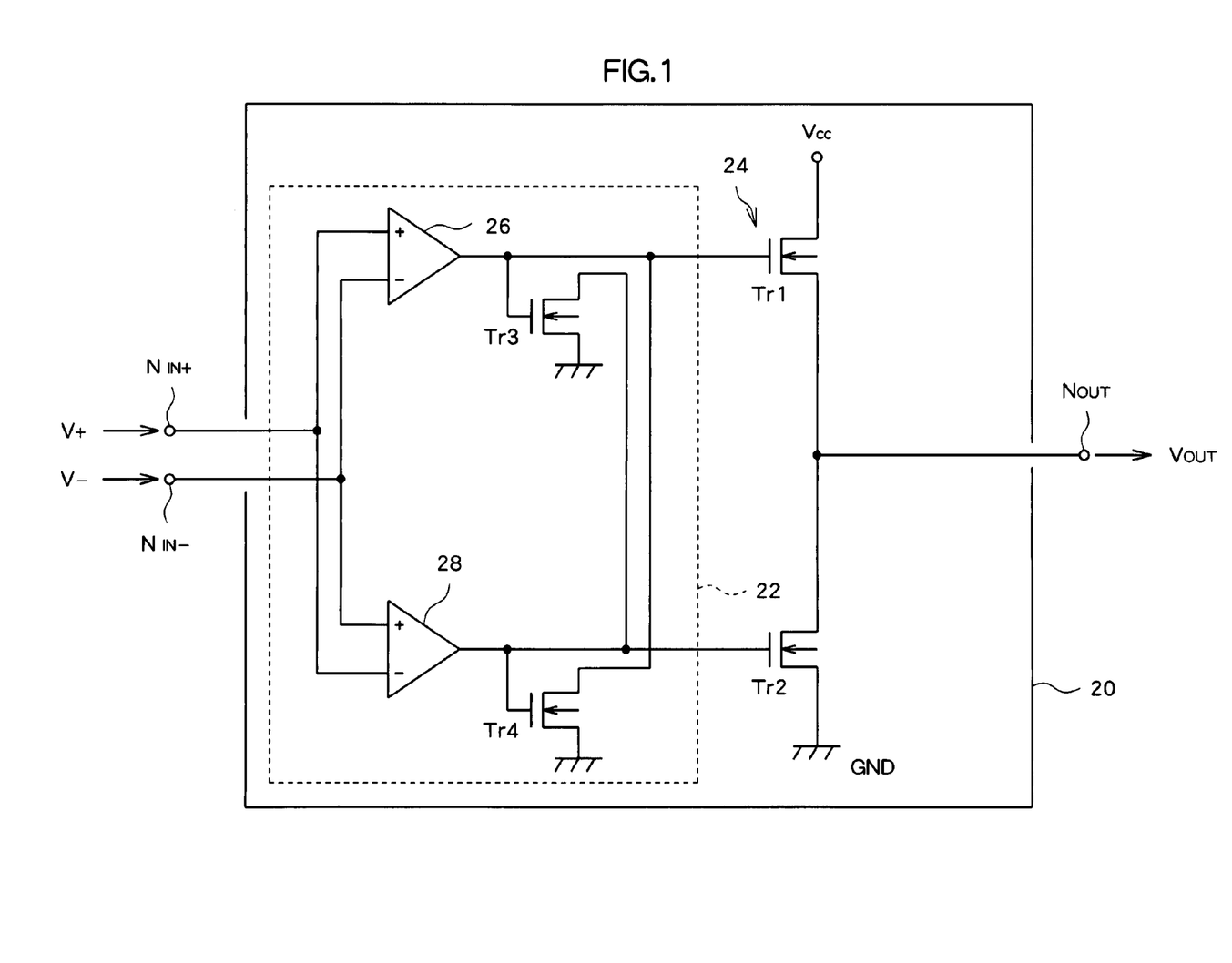
FIG. 1 is a view showing a schematic circuit configuration for a class AB operational amplifier in an embodiment of the present invention.

FIG. 1 is a view showing a schematic circuit configuration for a class AB operational amplifier 20 in an embodiment of the present invention. The operational amplifier 20 operates according to a voltage potential difference $V_{IN}$, in which voltage signals $V_+$ and $V_-$ are input at a non-inverting input terminal $N_{IN+}$ and an inverting input terminal $N_{IN-}$, respectively ($V_{IN}=V_+-V_-$). The operational amplifier 20 outputs an output voltage signal $V_{OUT}$, in which $V_{IN}$ is amplified, from an output terminal $N_{OUT}$.

The operational amplifier 20 has a pre-stage circuit 22 and an output stage circuit 24. The pre-stage circuit 22 has amplifiers 26, 28, and transistors Tr3, Tr4. The output stage circuit 24 is a push-pull circuit composed of transistors Tr1, Tr2.

Each of Tr1 and Tr2 is, for example, an n-channel MOS transistor. Additionally, Tr1, Tr2 have substantially the same size and operating characteristics. The drain of Tr1 is connected to a positive electrical power supply $V_{CC}$ and the source is connected to $N_{OUT}$. In Tr1, a first control signal, which is generated based on the output signal from the amplifiers 26, 28, is impressed from the pre-stage circuit 22 to the gate; and a drain current $I_{D1}$ conducted through the channel is controlled. By contrast, the drain of Tr2 is connected to $N_{OUT}$ and the source connected to GND. In Tr2, a second control signal, which is generated based on the output voltage signal from the amplifiers 26, 28, is impressed from the pre-stage circuit 22 to the gate; and a drain current $I_{D2}$ conducted through the channel is controlled.

In the amplifier 26, a non-inverting input terminal (+) is connected to $N_{IN+}$, and an inverting input terminal (−) is connected to $N_{IN-}$, and a differential signal $V_{IN}$ is fed to the amplifier 26. The amplifier 26 then amplifies the $V_{IN}$ fed thereinto at a gain $g_F$ using a class AB operation, and outputs a first original control signal $V_{AMP1}$ that is used to generate a first control signal and a second control signal corresponding to Tr1 and Tr2. By contrast, the arrangement in the amplifier 28 is the opposite of that in amplifier 26; namely, the non-inverting input terminal (+) is connected to $N_{IN-}$, the inverting input terminal (−) is connected to $N_{IN+}$, and a differential signal whose phase is the reverse of that used in to that of the amplifier 26; i.e., ($-V_{IN}$), is fed to the amplifier 28. The amplifier 28 then amplifies the ($-V_{IN}$) fed thereinto at a gain $g_F$ using a class AB operation, and outputs a second original control signal $V_{AMP2}$ that is used to generate a first control signal and a second control signal corresponding to Tr1 and Tr2.

Specifically, taking $v_{BIAS}$ (>0) to be the voltage of the operating points in a class AB operation, the amplifier 26 outputs $$V_{AMP1}=v_{BIAS}+g_F \cdot V_{IN}$$

in a positive signal period $P_+$ where $V_{IN}>0$, and outputs $$V_{AMP1}=v_{BIAS}$$

in other periods. By contrast, the amplifier 28 outputs $$V_{AMP2}=v_{BIAS}+g_{F1} \cdot (-V_{IN})$$

in a negative signal period $P_-$ where $V_{IN}<0$, and outputs $$V_{AMP2}=v_{BIAS}$$

in other periods. $v_{BIAS}$ may be set, e.g., to approximately 0.7 V, which is the voltage potential difference of a p-n junction.

Tr3 and Tr4 are configured so as to have substantially the same operating characteristics as Tr1 and Tr2, respectively; accordingly, n-channel MOS transistors are used for Tr3 and Tr4, as with Tr1 and Tr2. The gate of Tr3 is connected to the output terminal of the amplifier 26, and the drain is connected to the output terminal of the amplifier 28. The gate of Tr4 is connected to the output terminal of the amplifier 28, and the drain is connected to the output terminal of the amplifier 26. The respective sources of Tr3 and Tr4 are grounded at GND.

Tr3 operates based on the output $V_{AMP1}$ of the amplifier 26, and has a function for setting the gate of Tr2 to a cutoff voltage in accordance with a period, in which, predominantly, Tr1 is operating in the output stage circuit 24. By contrast, Tr4 operates based on the output $V_{AMP2}$ of the amplifier 28, and has a function for setting the gate of Tr1 to a cutoff voltage in accordance with a period, in which, predominantly, Tr2 is operating in the output stage circuit 24. Specifically, Tr3 is a cutoff circuit for Tr2, and Tr4 is a cutoff circuit for Tr1.

The pre-stage circuit 22 substantially outputs the first original control signal $V_{AMP1}$ from the amplifier 26 in the positive signal period $P_+$ as the first control signal for controlling the channel current (conducting current) of the first output transistor Tr1, and make Tr1 operate in class AB mode. However, providing the cutoff circuits causes the pre-stage circuit 22 to output not the first original control signal $V_{AMP1}$, but a signal for placing Tr1 in a cutoff state as the first control signal in the negative signal period $P_-$. By contrast, in relation to the second output transistor Tr2, the pre-stage circuit 22 substantially outputs the second original control signal $V_{AMP2}$ from the amplifier 28 in the negative signal period $P_-$ as the second control signal for controlling the channel current (conducting current) of the transistor Tr2 and makes Tr2 operate in class AB mode. However, the pre-stage circuit 22 outputs not the second original control signal $V_{AMP2}$, but a signal for placing Tr2 in a cutoff state and as the second control signal in the positive signal period $P_+$. The operation of the cutoff circuits shall be described below.

For convenience, FIG. 1 shows a configuration in which the drains of Tr3, Tr4 are connected to the gates of Tr2, and Tr1, respectively, and the potential of the gates can be directly controlled; however, in a configuration where a function as a cutoff circuit is obtained, other circuit configurations are also possible. For example, a configuration is possible in which the operating state of a differential amplifying circuit in the amplifier 28 is controlled according to the drain current of Tr3 so as to make $V_{AMP2}$ in the positive signal period of $V_{IN}$ into the cutoff voltage for Tr2 as substitute for $v_{BIAS}$ described above. In this configuration, the amplifier 26 is controlled according to the drain current of Tr4 so as to make $V_{AMP1}$ in the negative signal period of $V_{IN}$ into the cutoff voltage for Tr1.

Figure 2:
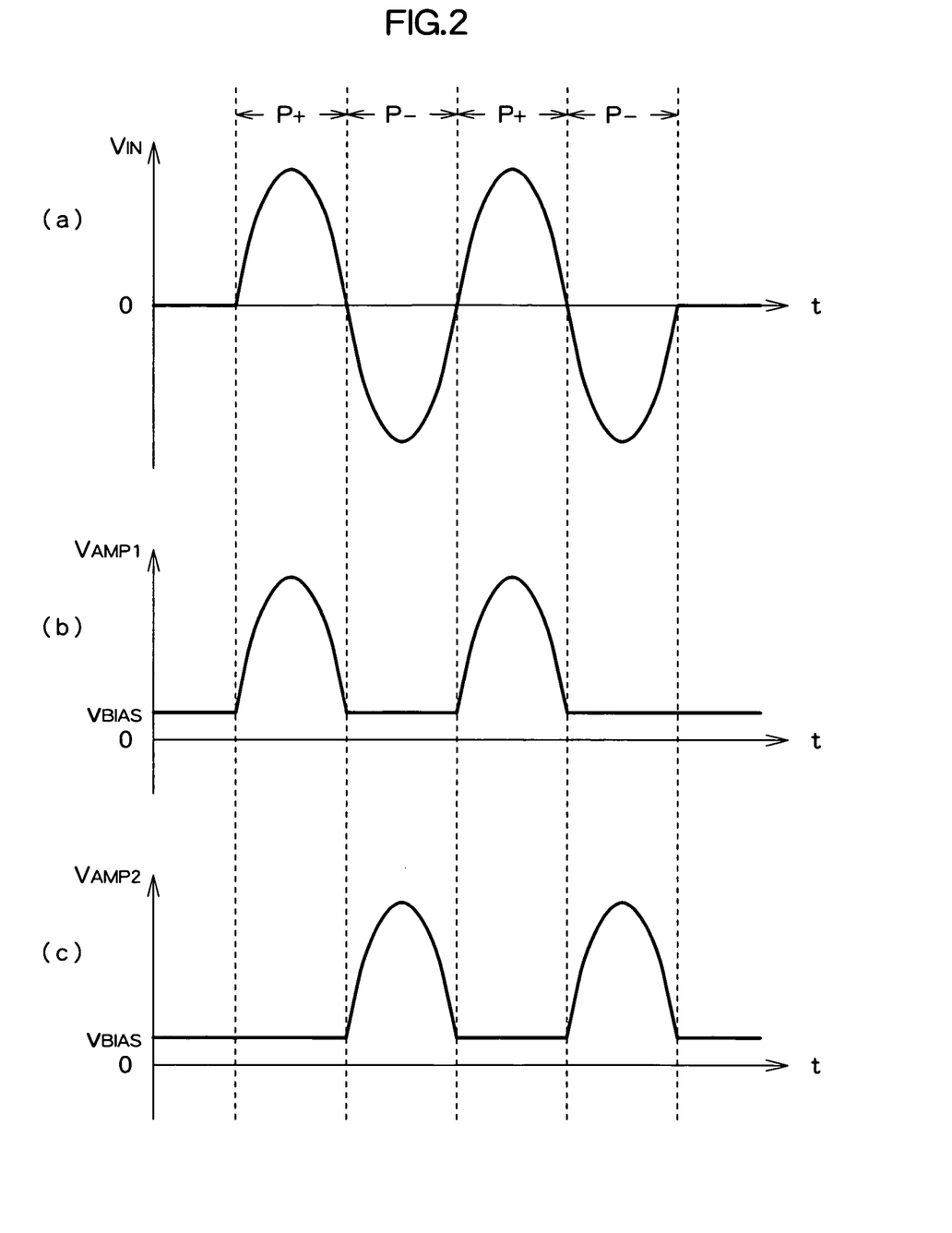
FIG. 2 is a schematic view of a signal waveform that illustrates an operation of the class AB operational amplifier shown in FIG. 1.
Figure 3:
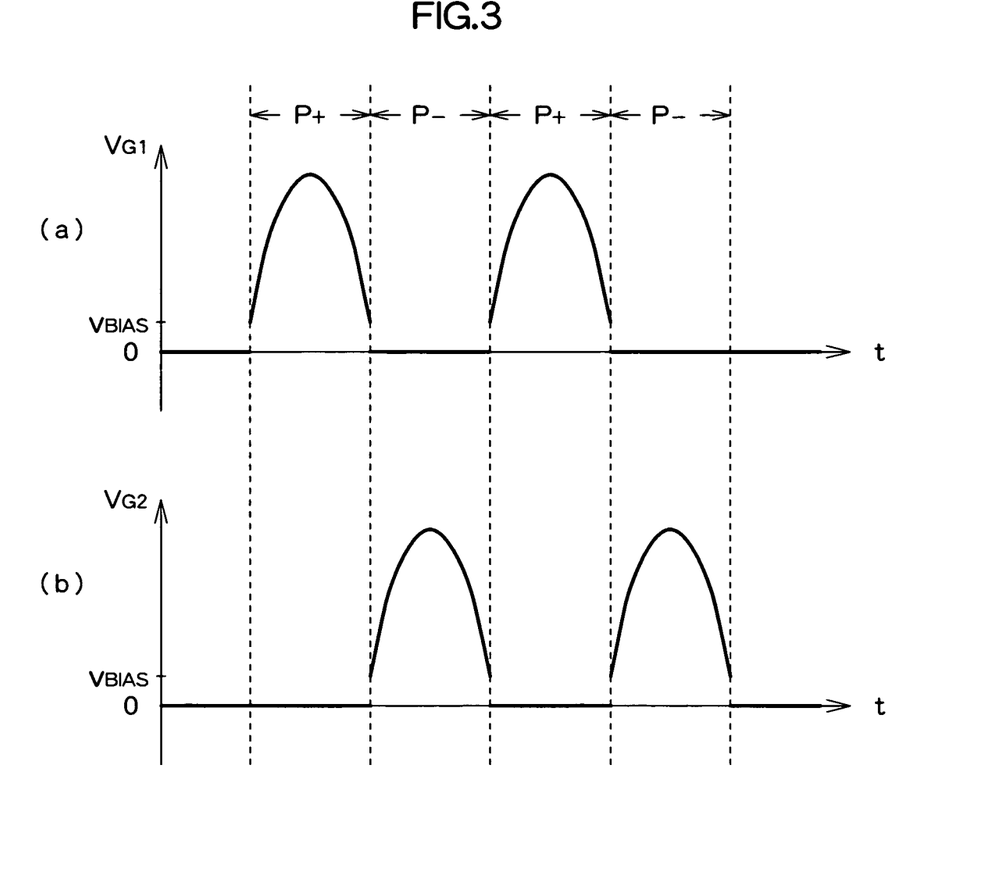
FIG. 3 is a schematic view of a signal waveform that illustrates an operation of the class AB operational amplifier shown in FIG. 1.
Figure 4:
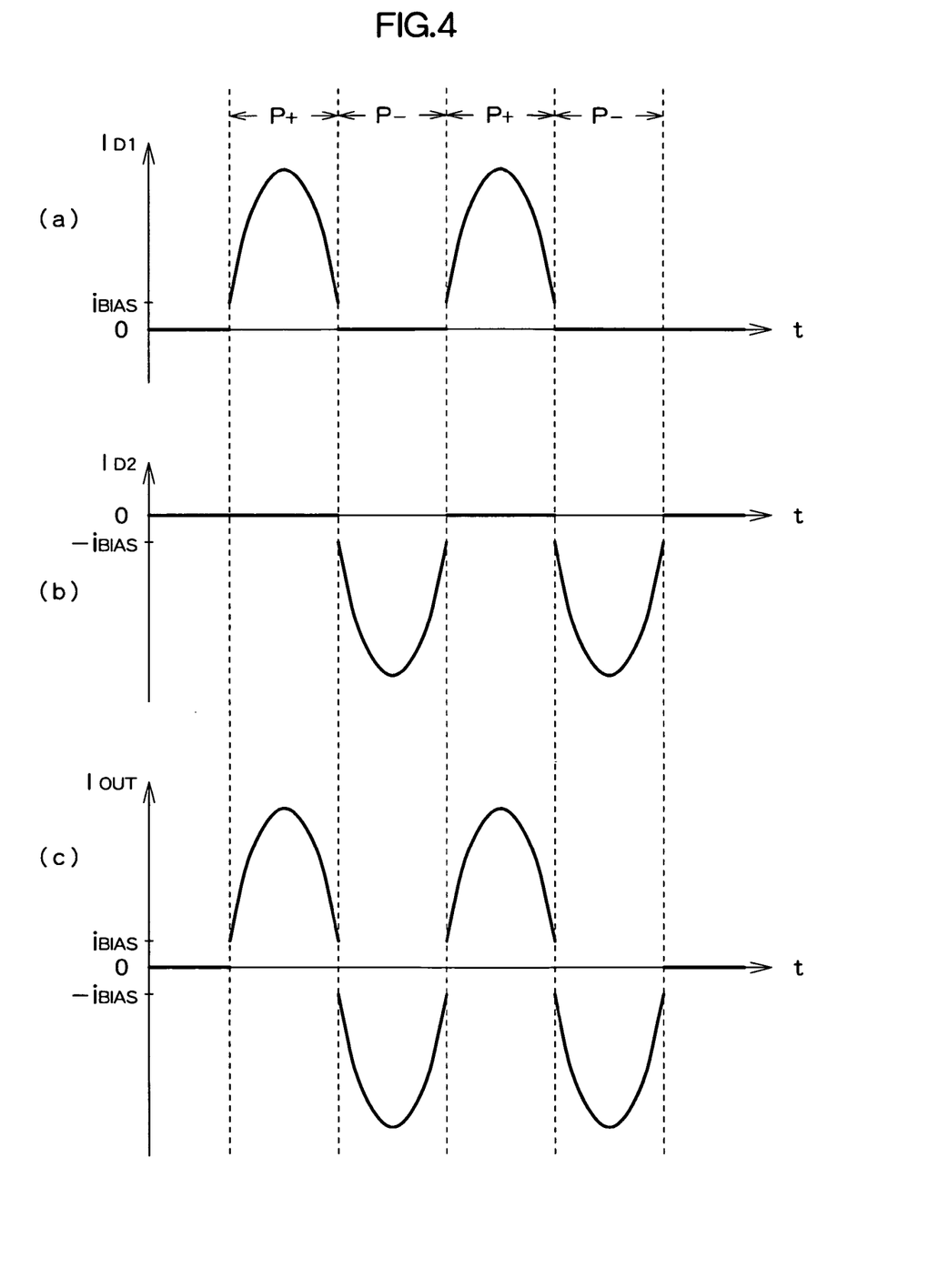
FIG. 4 is a schematic view of a signal waveform that illustrates an operation of the class AB operational amplifier shown in FIG. 1.

The operation of the circuit in FIG. 1 shall now be described. FIGS. 2 to 4 are schematic views of a signal waveform illustrating an operation of the operational amplifier 20 shown in FIG. 1. The vertical axis of each signal waveform represents the signal value, and the horizontal axis represents time.

The signal waveform (a) shown in FIG. 2 depicts a two-period sine wave as an example of the differential input $V_{IN}$ of the operational amplifier 20. The signal waveforms (b), (c) shown in FIG. 2 depict the output signals $V_{AMP1}$, $V_{AMP2}$ of the amplifiers 26, 28, respectively, in relation to $V_{IN}$. $V_{AMP1}$ changes according to $V_{IN}$ in the positive signal period $P_+$ of $V_{IN}$, but stays at $v_{BIAS}$ in the negative signal period $P_-$. By contrast, $V_{AMP2}$ stays at $v_{BIAS}$ in the positive signal period $P_+$ of $V_{IN}$, but changes according to $V_{IN}$ in the negative signal period $P_-$.

Tr3 becomes a state of conduction that is substantially better than in $P_-$ (ON state) by being applied $V_{AMP1}$ in $P_+$, and lowers a voltage $V_{G2}$ applied to the gate of Tr2 from the output voltage $v_{BIAS}$ of the amplifier 28 to the ground potential GND. On the other hand, Tr4 becomes a state of conduction (ON state) substantially better than in $P_+$ by being applied $V_{AMP2}$ in $P_-$, and lowers a voltage $V_{G1}$ applied to the gate of Tr1 from the output voltage $v_{BIAS}$ of the amplifier 26 to the ground potential GND. The signal waveforms (a), (b) of FIG. 3 show the waveforms of $V_{G1}$, $V_{G2}$.

Drain currents $I_{D1}$, $I_{D2}$, which correspond to the control signals $V_{G1}$, $V_{G2}$ generated from $V_{AMP1}$, $V_{AMP2}$, flow in Tr1, Tr2 of the output stage circuit 24. The signal waveforms (a), (b) shown in FIG. 4 depict the change over time of drain currents $I_{D1}$, $I_{D2}$, respectively, with the current flowing to the output terminal $N_{OUT}$ in the positive direction.

Of the transistors Tr1, Tr2 that constitute the output stage circuit 24, it is predominantly Tr1 that operates in $P_+$. In the period $P_+$, Tr1 operates in class AB based on $V_{G1}$, and causes $I_{D1}$, in which a signal current based on $(g_F \cdot V_{IN})$ has been added to an idle current $i_{BIAS}$ corresponding to $v_{BIAS}$, to flow to $N_{OUT}$. By contrast, in the period $P_+$, Tr2 is applied GND on the gate and substantially becomes a cutoff state. Specifically, the idle current $i_{BIAS}$ does not flow in Tr2, and the drain current $I_{D2}$ is substantially kept to 0.

Tr2 predominately operates in $P_-$. In the period $P_-$, Tr2 operates in class AB based on $V_{G2}$, and causes drain current $I_{D2}$, in which a signal current based on $\{g_F \cdot (-V_{IN})\}$ has been added to the idle current $i_{BIAS}$ corresponding to $v_{BIAS}$, to flow from $N_{OUT}$. By contrast, in the period $P_-$, Tr1 substantially enters a cutoff state, and the drain current $I_{D1}$ is substantially kept to 0. An output current $I_{OUT}$ combined $I_{D1}$ and $I_{D2}$ is obtained on $N_{OUT}$. The signal waveform (c) of FIG. 4 depicts the change over time in the output current $I_{OUT}$.

As described above, Tr3, Tr4 have substantially the same characteristics as Tr1, Tr2, respectively, but do not have to be of the same size as Tr1, Tr2. Specifically, since Tr3, Tr4, unlike Tr1, Tr2 of the output stage circuit 24, generally do not require a large drain current, Tr3, Tr4 can be made smaller than Tr1, Tr2.

The operational amplifier 20 shown in FIG. 1 is described above. The operational amplifier 20 shown in FIG. 1 is a basic aspect of the present invention, a primary characteristic thereof being that when one of the two transistors that constitute the class AB push-pull circuit in the output stage circuit 24 is predominant in the output signal, the other is in a cutoff state, and the electricity consumed by the idle current can be reduced. The amplifying circuit of the present invention can have other configurations that maintain this characteristic.

Figure 5:
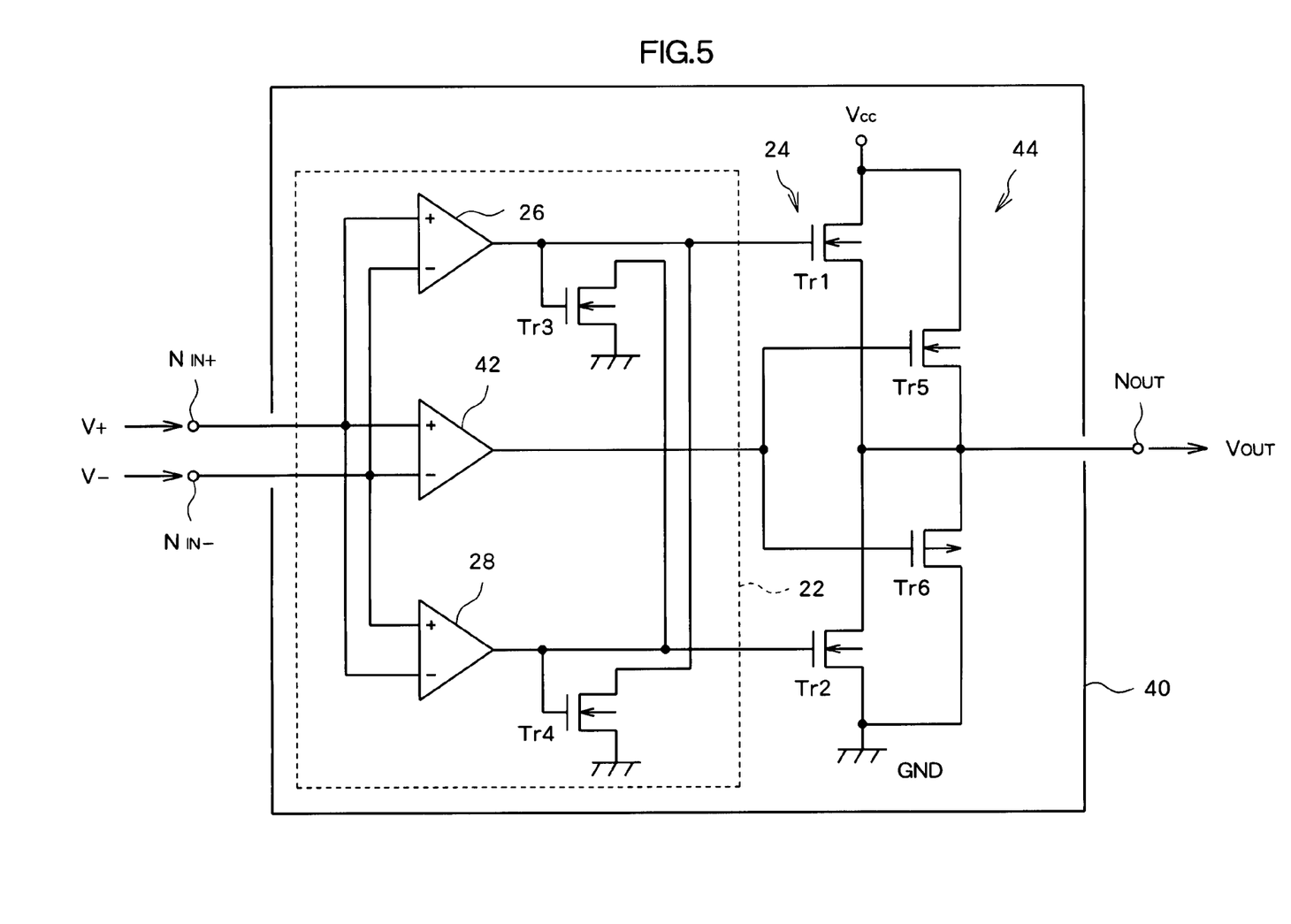
FIG. 5 is a view showing a schematic circuit configuration for a class AB operational amplifier according to the present invention, incorporating a modification to the configuration shown in FIG. 1.

FIG. 5 is a view showing a schematic circuit configuration for a class AB operational amplifier 40, incorporating a modification to the configuration shown in FIG. 1. The same reference numerals used for structural elements of the operational amplifier 20 described above are used in the operational amplifier 40 so as to simplify the description. The operational amplifier 40 primarily differs from the operational amplifier 20 in that an amplifier 42 (auxiliary pre-stage circuit) and an output stage circuit 44 (auxiliary output stage circuit) are added.

The output stage circuit 44 comprises transistors Tr5, Tr6, and is a push-pull circuit connected to $N_{OUT}$ provided in parallel to the output stage circuit 24. Tr5, Tr6 are MOS transistors, for example. The drain of Tr5 is connected to the positive electrical power supply $V_{CC}$ and the source is connected to $N_{OUT}$. The drain of Tr6 is connected to $N_{OUT}$ and the source is connected to GND. The output of the amplifier 42 is impressed to the respective gates of Tr5, Tr6, both of which transistors being configured so as to operate complementarily. For example, when an n-channel MOS transistor has been used for Tr5, a p-channel MOS transistor is used for Tr6.

In the amplifier 42, a non-inverting input terminal (+) is connected to $N_{IN+}$ and an inverting input terminal (−) is connected to $N_{IN-}$, and a differential signal $V_{IN}$ is fed to the amplifier 42. The amplifier 42 then amplifies the $V_{IN}$ fed thereinto using a class AB operation, and an output signal $V_{AMP3}$ is formed.

The output stage circuit 44 operates as a class AB push-pull circuit in accordance with $V_{AMP3}$, which is impressed to the gates of Tr5, Tr6. The output stage circuit 44 substantially operates in the same phase as that of the output stage circuit 24, but is set to have a lesser drive capability than the output stage circuit 24. In consideration of this fact, Tr5, Tr6 are set to be smaller than Tr1, Tr2, for example. The output stage circuit 24 described above performs an operation wherein one of the transistors is cut off, and that transistor is switched between the positive signal period $P_+$ and the negative signal period $P_-$. In contrast, the output stage circuit 44 does not perform such an operation; the idle current flows from $V_{CC}$ to GND in the output stage circuit 44 substantially at all times. Since the drive capability of the output stage circuit 44 is low, as described above, the idle current is smaller than $i_{BIAS}$ in the output stage circuit 24.

In the operational amplifier 20, it is conceivable that both Tr1 and Tr2 will reach a cutoff state in the vicinity of the zero cross point due to a timing misalignment between the operation of Tr1 to Tr4, at which time $N_{OUT}$ can reach a state of high impedance. In the operational amplifier 40 provided in the output stage circuit 44, even if both Tr1 and Tr2 reach a cutoff state in the vicinity of the zero cross point, an increase in the output impedance of $N_{OUT}$ can accordingly be avoided or minimized because Tr5, Tr6 of the output stage circuit 44 will be in an ON state.

The structure in which the output stage circuit 44 is provided may also be intentionally designed so that both Tr1 and Tr2 enter a cutoff state in the vicinity of the zero cross point. It is thereby possible to avoid unstable operation in the vicinity of the zero cross point due to timing misalignments in the operation of Tr1 to Tr4 or other reasons.

An example of such an operational amplifier 40 is a circuit configured so that Tr3 enters an ON state earlier than Tr1 in response to an increase in the output $V_{AMP1}$ of the amplifier 26, and Tr4 enters an ON state earlier than Tr2, in response to an increase in the output $V_{AMP2}$ of the amplifier 28. Specifically, in an operational amplifier 40 of such description, a diode, a source follower circuit, or another circuit can be used to set the gate potential of Tr3 approximately 0.7 V higher than the gate potential of Tr1, and to set the gate potential of Tr4 approximately 0.7 V higher than the gate potential of Tr2.

In this configuration, a period in which Tr4 has placed Tr1 in a cutoff state in accordance with $P_-$ (a first cutoff period) is slightly lengthened before and after $P_-$; also, a period in which Tr3 has placed Tr2 in a cutoff state in relation to $P_+$ (a second cutoff period) is slightly lengthened before and after $P_+$. As a result, the first cutoff period and second cutoff period overlap at the zero cross point. In such an event, the result of the first cutoff period encroaching on either end of $P_+$ is that the period in which Tr1 operates in class AB and is able to amplify $V_{IN}$ (first ON period) is made to be shorter than $P_+$; also, the result of the second cutoff period encroaching on either end of $P_-$ is that the period in which Tr2 operates in class AB and is able to amplify $V_{IN}$ (second ON period) is made to be shorter than $P_-$.

According to the present invention, one transistor among a first output transistor and a second output transistor in an output stage circuit that constitutes a class AB push-pull circuit generates a current that changes according to an input signal, and in the corresponding period, the other transistor enters a cutoff state and operates so that an idle current substantially does not flow. Electricity consumption can accordingly be reduced by a corresponding amount.

What is claimed is:

1. An amplifying circuit, comprising:
an output stage circuit provided with a first output transistor for controlling a conducting current based on a first control signal and a second output transistor for controlling a conducting current based on a second control signal, the transistors causing the output stage circuit to operate as a class AB push-pull circuit; and
a pre-stage circuit, in which the first control signal and the second control signal are generated in accordance with an input signal;
wherein,
the first control signal causes the first output transistor to operate in class AB mode in a first ON period set in accordance with a positive signal period in which the input signal is positive, and places the first output transistor in a cutoff state in a first OFF period set in accordance with a negative signal period in which the input signal is negative; and
the second control signal causes the second output transistor to operate in class AB mode in a second ON period set in accordance with the negative signal period, and places the second output transistor into a cutoff state in a second OFF period set in accordance with the positive signal period,
the pre-stage circuit comprising:
a first control circuit for generating, based on the input signal, a first original control signal, which makes the first output transistor operate in class AB mode, the first control circuit being capable of impressing the first original control signal as a control signal on the first output transistor;
a second control circuit for generating, based on the input signal, a second original control signal, which makes the second output transistor operate in class AB mode, the second control circuit being capable of impressing the second original control signal as a control signal on the second output transistor;
a second output transistor cutoff circuit for operating in the second OFF period based on the first original control signal, and for setting the control signal impressed on the second output transistor to a cutoff voltage; and
a first output transistor cutoff circuit for operating in the first OFF period based on the second original control signal, and for setting the control signal impressed on the first output transistor to a cutoff voltage.

2. An amplifying circuit, comprising:
an output stage circuit provided with a first output transistor for controlling a conducting current based on a first control signal and a second output transistor for controlling a conducting current based on a second control signal, the transistors causing the output stage circuit to operate as a class AB push-pull circuit; and
a pre-stage circuit, in which the first control signal and the second control signal are generated in accordance with an input signal;
wherein,
the first control signal causes the first output transistor to operate in class AB mode in a first ON period set in accordance with a positive signal period in which the input signal is positive, and places the first output transistor in a cutoff state in a first OFF period set in accordance with a negative signal period in which the input signal is negative; and
the second control signal causes the second output transistor to operate in class AB mode in a second ON period set in accordance with the negative signal period, and places the second output transistor into a cutoff state in a second OFF period set in accordance with the positive signal period;
an auxiliary output stage circuit that is a push-pull circuit provided on an output terminal of the output stage circuit in parallel to the output stage circuit; and
an auxiliary pre-stage circuit for causing the auxiliary output stage circuit to operate in class AB mode in accordance with the input signal, and for causing the auxiliary output stage circuit to generate an output signal to the output terminal that is in phase with an output signal generated by the output stage circuit;
wherein
the auxiliary output stage circuit has a lower load driving capability than the output stage circuit.

* * * * *